United States Patent [19]

Kyser et al.

[11] 4,189,734
[45] Feb. 19, 1980

[54] METHOD AND APPARATUS FOR RECORDING WITH WRITING FLUIDS AND DROP PROJECTION MEANS THEREFOR

[75] Inventors: Edmond L. Kyser, Portola Valley; Stephan B. Sears, Belmont, both of Calif.

[73] Assignee: Silonics, Inc., Sunnyvale, Calif.

[21] Appl. No.: 489,985

[22] Filed: Jul. 19, 1974

Related U.S. Application Data

[63] Continuation-in-part of Ser. No. 50,445, Jun. 29, 1970, Pat. No. 3,946,398.

[51] Int. Cl.² ............................................. G01D 15/16
[52] U.S. Cl. .................................... 346/1.1; 310/317; 310/331; 346/140 R
[58] Field of Search ........................ 346/140, 75, 1; 310/8.1, 317, 330–332

[56] References Cited

U.S. PATENT DOCUMENTS

3,108,673  10/1963  Green .................................. 197/1 R

FOREIGN PATENT DOCUMENTS

2256667  6/1974  Fed. Rep. of Germany ...... 346/140 R
364385  5/1974  Sweden ............................. 346/140 R

OTHER PUBLICATIONS

Kotla et al.; Bimetallic Differential-Wetting Piezoelectric Printing Device; IBM Tech. Disc. Bulletin, vol. 15, No. 5, Oct. 1972, pp. 1418–1419.

*Primary Examiner*—Joseph W. Hartary
*Attorney, Agent, or Firm*—Limbach, Limbach & Sutton

[57] ABSTRACT

A recording apparatus and method is disclosed which includes a writing fluid source feeding a drop projection means which ejects a series of droplets of writing fluid from a nozzle in a discontinuous stream with sufficient velocity to traverse a substantially straight trajectory to a recording medium. The volume of each droplet is individually controlled by electrical pulses applied to the projection means from an electronic driver. A plurality of such projection means may be employed and connected to control means whereby to print or form predetermined graphical intelligence patterns on a recording medium.

15 Claims, 9 Drawing Figures

METHOD AND APPARATUS FOR RECORDING WITH WRITING FLUIDS AND DROP PROJECTION MEANS THEREFOR

CROSS-REFERENCE TO RELATED APPLICATION

This application is a continuation-in-part of application Ser. No. 50,445, filed June 29, 1970 now U.S. Pat. No. 3,946,398.

BACKGROUND OF THE INVENTION

This invention relates generally to a non-impact printing apparatus and method and more particularly to an apparatus and method in which the printing fluid is ejected from a nozzle, by volume displacement.

Historically printing has been done by applying ink to a specially configured key or carrier and mechanically impacting the key or carrier on a recording medium such as paper to form an impression of the carrier. More recently, non-impact printing devices have been developed, where intelligence patterns (alphanumeric characters, graphical displays, etc.) are deposited on a recording medium. Non-impact printing devices utilize a variety of methods of forming the intelligence patterns, including chemically active and chemically inert processes, using either fluids or solids as the marking or printing medium, and requiring either specially treated recording media or untreated recording media.

It has been known to print by depositing discrete droplets of printing fluid on a recording medium in a predetermined pattern. Previous attempts to achieve such a method of printing utilize a continuous stream of fluid which separates into droplets which are charged and electrostatically deflected so that they form the desired pattern on the recording medium. Such methods produce acceptable resolution only when the charge per unit mass is accurately controlled for each droplet. Two basic variations have been developed: the droplets are either given equal charge per unit mass and then deflected by an electrostatic field whose intensity is controlled by the input signal, or the droplets are given a charge per unit mass according to the input signal and then deflected using a constant electrostatic field. Existing embodiments of both of these methods require that the fluid droplets be uniform, which has proven difficult to achieve. Once the stream of uniform droplets has been attained, it is usually necessary to provide voltages in the range of 2,000 to 10,000 volts for the electrostatic field. Such voltages are difficult and expensive to produce and control. Further, the process of charging the droplets themselves sometimes causes electrolysis of the printing fluid, producing corrosive byproducts which may cause electrode deterioration.

In an effort to obtain droplets of uniform size, two basic methods have been developed in the prir art. First, the printing fluid is delivered to a nozzle at sufficient pressure to assure that a continuous jet of fluid issues from the nozzle. The jet stream is separated into droplets by using radial oscillations or vibrations induced in the nozzle itself by means of magnetostrictive drivers or piezoelectric crystals. The vibrations cause regularly spaced varicosities in the ink stream, aiding the natural tendency of the stream to separate into droplets, and making the ensuing droplets more uniform than would otherwise occur.

In another embodiment of the droplet formation process, the printing fluid is delivered to the nozzle under sufficient pressure to form a meniscus at the nozzle but not high enough to produce flow through the nozzle. In this method, the fluid is drawn from the nozzle electrostatically in a ray-like jet which is then deflected electrostatically as desired. The electrostatic field which draws the jet of fluid from the nozzle is constant, producing a continual stream of printing fluid. The stream breaks into a succession of droplets with essentially uniform mass and charge. A time-varying electrostatic field controlled by an input signal is then used to deflect the droplets as required for the formation of alphanumeric characters.

The foregoing printing processes and mechanisms make use of a continuous flow of printing fluid, with the flow to be diverted to a reject basin or collector whenever no characters or patterns are to be printed. This results in a more complicated system for handling the flow of printing fluid than would otherwise be required.

In another type of device, piezoelectric transducers are employed to create shock waves in a horn-shaped nozzle. As the waves travel down along the nozzle from the large end to the small end, their intensity increases. The additive effect of high intensity shock waves at resonance serve to eject fluid from the end of the nozzle towards and onto an associated printing medium.

Other devices have been developed to expand and contract a crystal by electrical pulses tuned to a resonant frequency so that one droplet is ejected for each expansion or contraction of the crystals. However, these devices do not operate asynchronously. That is, a droplet is not produced only upon demand but rather continuously while operating at resonant frequency; thus any given droplet is dependent on previous pulses transmitted through the fluid.

Our prior application Ser. No. 50,445, filed June 29, 1970, is an asynchronous device of the same general character as the present device. In specific embodiments, however, the present invention shows an electromechanical transducer of a single electrically deformable plate, whereas the specific crystal in our prior application was a plate of two bonded crystals.

OBJECTS AND SUMMARY OF THE INVENTION

It is a general object of the present invention to provide an improved printing method and apparatus for recording with writing fluids and an improved drop projection means for use with such apparatus.

It is another object of the present invention to provide a drop projection means or head which asynchronously projects droplets having a controlled volume from a nozzle towards a printing medium responsive to electrical signals.

It is another object of the present invention to provide an improved method and apparatus for recording alphanumeric and graphical intelligence patterns on a recording medium by means of deposition of droplets of printing fluid on the recording medium in an economical and reliable manner.

It is a further object of the present invention to provide a drop projecting means which projects drops from a nozzle responsive to electrical signals and in which the volume of the drops is controlled by the applied electrical signals.

It is still a further object of the invention to provide a printing apparatus which is simple in construction; reliable in operation; capable of printing 1,000 characters per second; low in power requirements, cost and weight; and substantially noiseless compared to impact printers.

The foregoing and other objects are achieved by a drop projection means or head in which a nozzle communicates with a fluid chamber fed from an associated fluid reservoir. An electro-mechanical transducer is associated with one wall of said chamber to rapidly vary the volume of said chamber responsive to electrical pulse signals whereby a single fluid droplet having a volume dependent upon the electrical signal is ejected from the nozzle asynchronously as the signal demands. Webster's Third New International Dictionary defines the word "synchronous" as: "... recurring or operating at exactly the same periods: marked by strict and exact coincidence in time, rate, or rhythm...". As used in the present invention, the term "asynchronously" means lacking in a specific rate or rhythm. It is essential to the printing of intelligible matter that the droplet ejection be asynchronous in view of the fact that the droplets follow a substantially straight trajectory to the printing medium and are not deflected. The invention also relates to a printer employing a plurality of such printing heads to print various configurations, such as alphanumeric and graphical intelligence patterns, and to the method of printing such configurations.

DESCRIPTION OF THE PREFERRED EMBODIMENT

Figure 1:
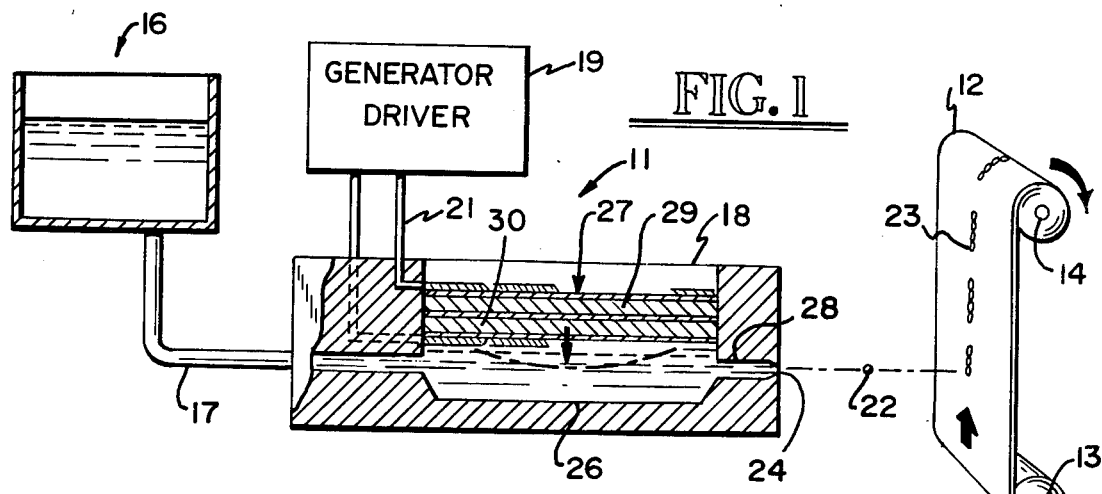
FIG. 1 is a schematic diagram, partially in cross-section, representing a recorder incorporating drop projecting means in accordance with the present invention.

FIG. 1 is a schematic representation of an apparatus 11 adapted to record information on a recording medium 12. The recording medium 12 is shown as moving relative to apparatus 11 from supply roller 13 to take-up roller 14. However, it will be appreciated that relative movement between the apparatus 11 and the recording medium 12 may be in any suitable manner, with actual movement taking place either by the apparatus 11, the recording medium 12 or both.

Apparatus 11 includes an ink reservoir 16 which may be any suitable reservoir for the particular printing fluid used. Ink source 16 feeds through tube 17 to a drop projecting means on printing head 18. An electronic pulse generator 19 applies pulses to the printing head 18 through an appropriate transmission means 21, such as wires. Upon receiving a pulse from driver 19, printing head 18 discharges and projects a single discrete droplet 22 of printing fluid from orifice 24. Each electrical pulse generates a single droplet, independently of any previous signals, with the volume of the drop being controlled by the applied electrical pulse. In the embodiment shown in FIG. 1, the droplets form a line 23 on recording medium 12 as it is moved past the printing head 18. The driver 19 does not operate at a resonant frequency, rather it calls for a droplet according to the predetermined pattern to be printed.

For accurate recording of information on recording medium 12, a substantially straight trajectory is followed from orifice 24 on printing head 18 to recording medium 12. In this manner, careful positioning of the recording medium relative to apparatus 11, or vice versa, results in impingement of droplets in a predictable pattern according to signals generated by electronic driver 19, which is determined by the information to be printed. For the best recording of information, the droplet should be of a precise and predictable shape and volume. That is, each droplet must closely follow the electronic signals from driver 19 so that equally spaced signals give equally spaced droplets.

The droplet 22 is discharged from head 18 by the sudden reduction of volume in chamber 26. This sudden reduction in volume is accomplished by deflecting a plate 27 into the chamber 26 to displace sufficient ink to form a droplet 22. The deflection must be sudden enough to impart sufficient kinetic energy to the fluid in nozzle 28 to accelerate a portion of it beyond the escape velocity. Escape velocity is the minimum velocity which will cause a plug of ink extending from the nozzle to separate from the nozzle and form a free droplet.

The escape velocity can be determined by equating the kinetic energy of the droplet to the energy required to form the surface of the droplet:

$$\text{Escape Velocity} = [12\sigma/\rho D]^{\frac{1}{2}}$$

where $\sigma$ is the surface tension constant of the fluid, $\rho$ is the density of the fluid, and D is the diameter of the droplet. As an example, the escape velocity of a droplet of water 0.015 centimeters in diameter is 167 centimeters per second.

In order to achieve this, the deflection plate must generate a pressure in the fluid capable of accelerating the fluid in the nozzle from rest to a velocity in excess of escape velocity by the time that the fluid has moved to extend a plug approximately one droplet diameter from the orifice. This minimum pressure is given by $$\text{Minimum Pressure} = 6K\sigma/D$$

where K is a dimensionless constant for the given geometry of the device and depends on the specific geometry and dimensions, $\sigma$ is the surface tension constant, and D is the droplet diameter. K usually is between 4 and 40. For a 0.015 cm water droplet, fired from a head with $K=10$, the minimum pressure is $2.8 \times 10^5$ Dynes/cm.$^2$, or approximately 4 pounds per square inch. The pressure plate must also displace an amount of fluid greater than the volume of the droplet to be ejected, since a portion of the fluid displaced by the pressure plate flows backward through the inlet.

The action of the pressure plate is such that as the plate returns to its rest position, a negative pressure pulse is generated that is approximately equal in magnitude to the positive pressure pulse. The negative pressure pulse reverses the direction of fluid flow in the nozzle, which assists the separation of the plug extending from the nozzle generating a free droplet. The maximum pressure at which the head may be operated is determined by the onset of cavitation during the corresponding negative pressure pulse. The onset of cavitation is very difficult to express analytically, being dependent on frequency and viscosity, among other parameters. A practical upper limit for the print head pressure may be taken to be $3.5 \times 10^6$ Dynes per square centimeter, or approximately 50 pounds per square inch.

The inward deflection of plate 27 is shown in dotted lines in FIG. 1. A suitable plate that is capable of deflecting into the chamber 26 upon receiving an electrical signal from drive 19 is an assembly of two piezoelectric crystals 30 and 29 bonded together. Electrical connection 21 from driver 19 applies a voltage across the two faces of the plate so that the upper segment 29 contracts and the lower segment 30 expands so the entire plate 27 flexed inwardly into chamber 26. Plate 27 may be obtained commercially from Clevite Corporation, Cleveland, Ohio, under the trade name "Bimorph". The plate assembly is attached to head 18 in such a manner as to permit minute rotations at the edge of the assembly. Such attachment can be made using a wide variety of epoxy adhesives.

After a droplet has been ejected, the plate returns to its normal position and the miniscus of the liquid is drawn back in the orifice approximately one droplet diameter. This liquid must be replaced before the printer can be activated again to eject another droplet, and the capillary action of the fluid in the orifice provides the required force. Due to this replacement process, the maximum speed at which droplets can be ejected is approximately $$\text{Maximum Dot Frequency} \approx [\sigma/\rho K D^3]^{\frac{1}{2}}$$

Again using the example of a 0.015 cm droplet of water ejected by a printer with geometry such that $K=10$, the maximum dot frequency is approximately 1440 drops per second for this example. For smaller droplet sizes, the maximum dot rate will increase, as will the maximum print rate in characters per second. If K is reduced to 44, then the maximum print rate would be about 1600 characters per second while printing with 0.0025 cm diameter dots. Dot rates as high as 50,000 drops per second may be achieved in this system, depending on the value of K, which in turn, depends on the geometry of the device. Where the droplet size is 10 times larger (0.025 cm), the maximum print rate decreases to 500 characters per second. While the maximum dot frequency in this exammple is as stated for best results, it is possible to operate at a faster rate even though complete replacement of fluid in the orifice has not taken place. In other words, still higher speeds may be attained even though each dot may not be perfect. Also momentum in the system during operation permits faster replacement of ink to the orifice.

Figure 2:
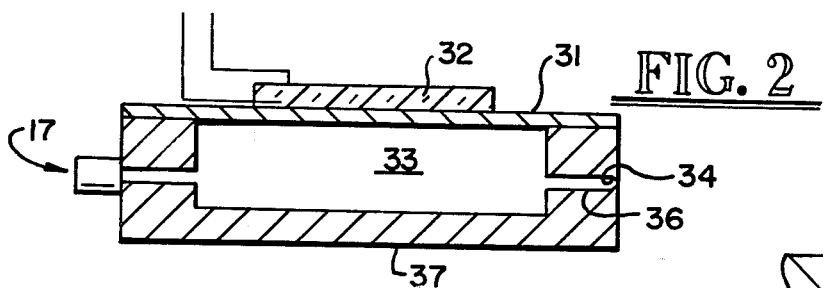
FIG. 2 is a cross-sectional view of a printing head having an alternative configuration to that of FIG. 1.

A preferred embodiment of a single head that is better suited for multiple head arrays is shown in FIG. 2. FIG. 2 shows a cross-sectional view of a single print head, similar to FIG. 1. In FIG. 2, the deflection plate has two components: a cover slip 31, and a piezoelectric crystal 32 bonded to the cover slip. Upon application of voltage across the crystal, the crystal contracts, and the action of the contracting crystal 32 on the cover slip 31 causes the plate to deflect inward into chamber 33, reducing its volume sufficiently to eject a droplet from orifice 34 through nozzle 36. Cover slip 31 is bonded to a base plate 37.

Since the crystal and cover slip must interact to provide the volume displacement and pressure necessary for droplet ejection, there are several explicit relationships that must be met for optimum functioning. It is desirable that the neutral axis (point of zero strain) of the crystal-cover slip assembly be at the interface between them. This condition is met provided that $$(Et^2) \text{ crystal} = (Et^2) \text{ cover slip}$$

where E is the modulus of elasticity and t is the thickness of the respective components. The diameter of each projected droplet should be between 1 and 3 times the average cross-sectional dimension of the orifice.

Figure 3:
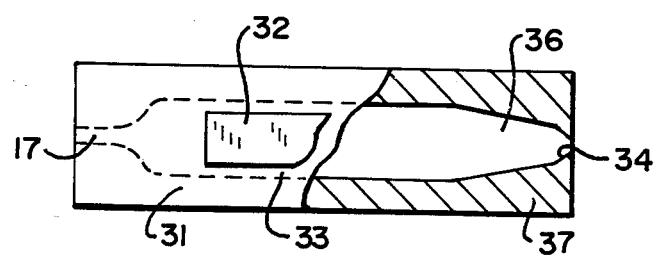
FIG. 3 is a top view, partially in cross-section, of the printing head shown in FIG. 2.

FIG. 3 is a plan view of the print head shown in FIG. 2. It will be seen that the crystal 32 is smaller in width than the pressure chamber 33, and this difference in dimensions is chosen to maximize the displacement attainable for a given width. We have found that the crystal should be approximately 70% as wide as the pressure chamber, and centered so as to equalize the gaps at both sides. The pressure chamber 33 and the crystal 32 are chosen in the form of a long rectangle. In this configuration, the width (smaller dimension of the rectangle) is chosen so as to provide the necessary pressure, and the length (larger dimension) is chosen so as to provide the necessary volume displacement. If the length exceeds 20 times the width, then the geometric factor K becomes undesirably large, which lowers the maximum dot frequency and raises the required minimum pressure. On the other hand, the length should be greater than twice the width to minimize the area of less than maximum deflection at the ends of the crystal. In volume each of the pressure chambers 33 should be between $1.6 \times 10^{-3}$ and $1.6 \times 10^{-2}$ cubic centimeters The diameter of orifice 34 is preferably small to enhance capillary actioned ink replacement, and to determine the size of the droplet. The nozzle 36 must be long enough to assure the drop follows a substantially straight trajectory parallel and coaxial with the orifice, but yet not excessively long, which would increase the geometric constant K, increase the pressure required, and decrease the maximum print rate. We have found that the nozzle length should be between 2 and 4 times the diameter of orifice 34.

We have found that the droplets upon impact with a printing surface produce printed spots two to four times the diameter of the droplet in flight. It then becomes obvious that the smaller the droplets, the more efficient the printing process becomes in terms of ink required to cover a given area. In addition, there is an increase in resolution, and an increase in the maximum print rate attainable when less ink is expelled in each droplet.

Figure 4:
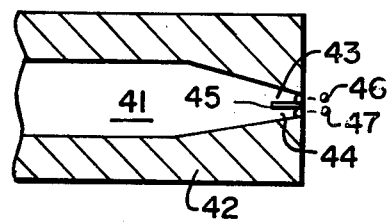
FIG. 4 is a partial cross-section of an alternative embodiment of a nozzle configuration.

FIG. 4 shows an alternative preferred embodiment of a nozzle configuration, where two independent orifices 43 and 44 formed by a divider 45 are fed by a common pressure chamber 41 within base plate 42. With each pulse of the pressure plate (not shown), two droplets 46 and 47 are ejected simultaneously in exactly the same manner as a single droplet would be ejected from a single orifice.

Figure 5:
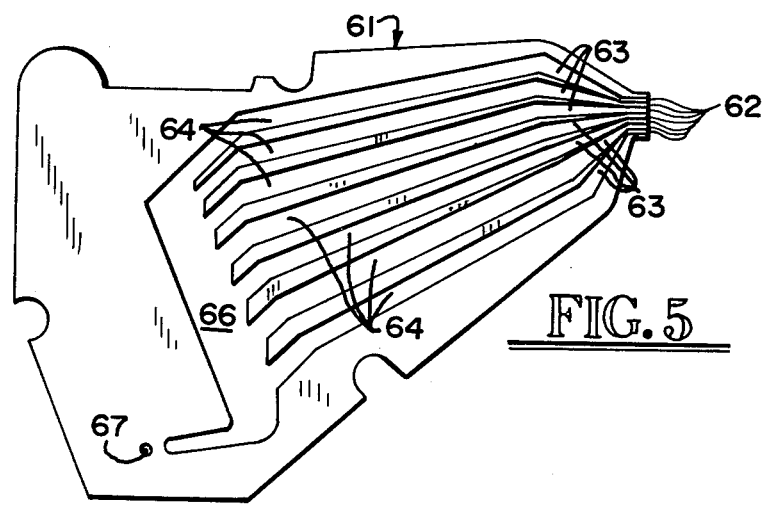
FIG. 5 is a plan view of a multi-chamber printing head.

FIG. 5 shows a cross-sectional view of a battery 61 of seven ink jet printers. Seven printers are compatible with commercially available character generators using a matrix of five dots wide and seven dots high. However, the system operates well using other dot matrices and a battery of between five and sixteen printers for the vertical component of the matrix. Each ink-jet printer contains the same elements which have been described in detail for single printers (FIG. 2). FIG. 5 shows the lower portion of a battery comprising a ceramic plate 61 having cavities etched into it to form the elements of the printer. Thus, plate 61 has seven nozzles 62, seven necks 63 and seven ink chambers 64. Over the ink chambers, on the upper portion of the battery (not shown, see FIG. 6), are seven crystals (not shown). Plate 61 also has etched therein a pulse trap chamber 66 communicating with each ink chamber opposite to the nozzles 62. The pulse trap chamber 66 serves, when filled with ink, to absorb back pressure of the ink. When the cover slip deflects into an ink chamber 64, a droplet is ejected from the corresponding nozzle 62, while at the same time ink is forced back toward pulse trap chamber 66. Thus, the volume displaced within ink chamber 64 must necessarily exceed the volume of ink ejected as a droplet.

Also shown in FIG. 5 is an opening 67 for connecting the ink source to a valve assembly presently to be described.

Figure 6:
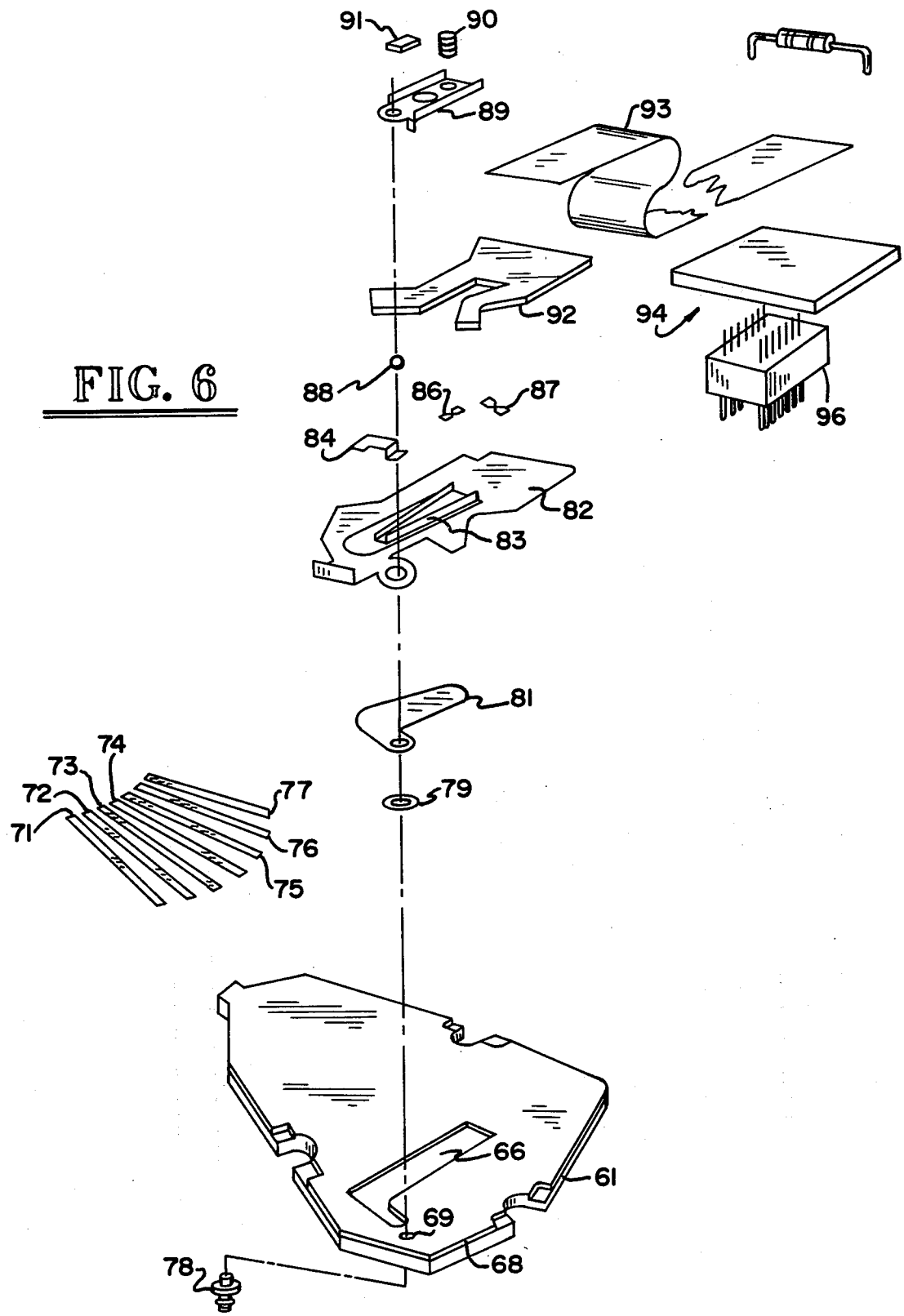
FIG. 6 is an exploded perspective view of the components in one embodiment of the ink jet printing head.

FIG. 6 is an exploded view of a system incorporating as an element the base plate 61 of the battery of seven nozzles shown in FIG. 5. In FIG. 6, base plate 61 has a cover slip 68 thereover and bonded to it to enclose the chambers, nozzles and necks described previously. Unlike plate 61 which has chambers etched in it, slip 68 has only two openings: a large one defining pulse trap chamber 66 and a valve opening 69. Each of the ceramic plates 61 and 68 may conveniently be made of "Photoceram", a trade name of Corning Glass Corp., Corning, N. Y. Overlying cover slip 68 and bonded thereto are seven piezoelectric crystals 71–77. On the under side of lower plate 61 is a tube fitting 78 which fits in opening 67 (FIG. 5). A tube (not shown) connects the ink source to fitting 78.

For manufacturing convenience, a series of 7 nozzles in an array may be made with the nozzles between 0.005 and 0.025 centimeters in diameter. The distance between the first and last nozzles in the series should not exceed 0.25 centimeters in order to accommodate the usual print character size. Most typewriters, for example, have a character height of approximately 0.25 centimeters, and the present device approximates that size.

On top of the battery, at valve opening 69, a valve seal 79 is affixed. Overlying cover slip 68 at the two openings is a diaphragm 81. Diaphragm 81 is preferably made of a flexible material such as Saran plastic (Dow Chemical Co., Midland, Mich.). Diaphragm 81 forms the upper wall on pulse trap chamber 66. Overlying diaphragm 81 is a regulator frame 82, preferably made of steel. Frame 82 is conveniently made in an outline generally corresponding to that of diaphragm 81, since it will both cover chamber 66 as well as valve opening 69. Frame 82 has an opening punched out to accommodate opening 69 on plate 61 and another U-shaped cut to form a long tongue 83. Tongue 83 is formed by folding up the sides of the tongue to form a channel having a long moment arm. The movement of tongue 83 is limited by bar 84. At the base of tongue 83 are two strain gauges 86 and 87 one of which serves to measure the strain at the point at which tongue 83 is attached to the remainder of frame 82 and the second provides a control reference. The strain gauges are designed to sense the pressure within pulse trap chamber 66. As the ink flows into pulse trap chamber 66 under greater pressure, it raises the diaphragm 81 and tongue 83 lying thereover. As tongue 83 raises, it creates a greater strain on strain gauge 86 which, by comparison with control strain gauge 87 serves to electrically indicate the pressure within pulse trap chamber 66.

As strain gauge 87 exhibits strain corresponding to a change in pressure, it causes the opening of a gate valve in relation to the pressure being sensed. The gate valve regulates flow through opening 69. Plug 88 is secured to valve beam 89, diaphragm 81 and seal 79. When plug 88 is raised from opening 69, ink is permitted to flow out of opening 69 into pulse trap chamber 66 under diaphragm 81.

Figure 7:
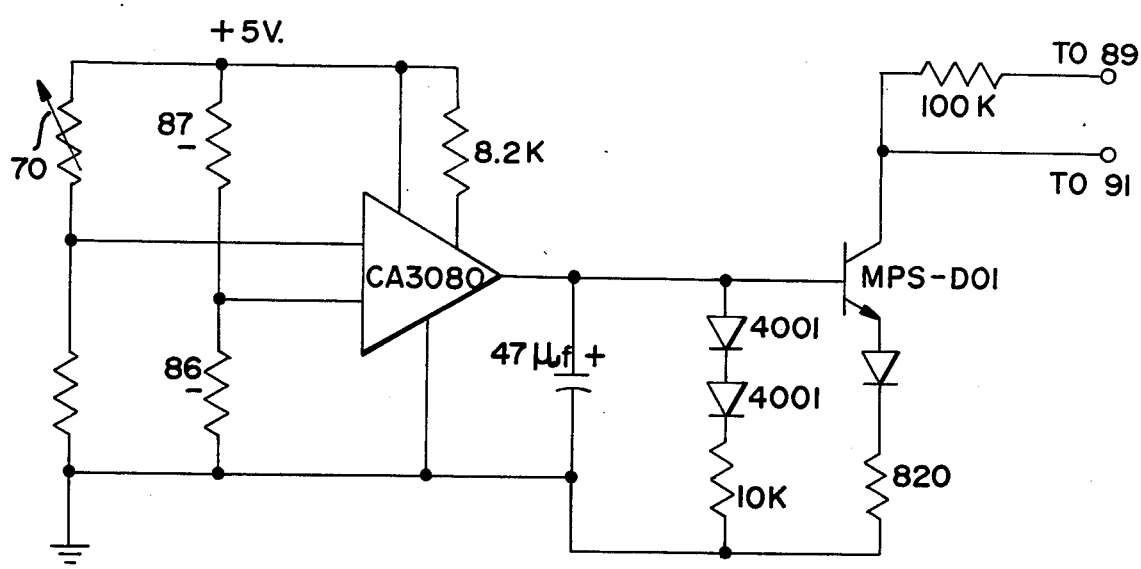
FIG. 7 is a circuit diagram of the ink control circuit.

The control plug 88 is governed by beam 89. Beam 89 is preferably a stainless steel reaction plate which is mounted on cover slip 68. Bonded to beam 89 is a piezoelectric crystal 91 which is electrically controlled by strain gauges 86 and 87 as shown in FIG. 7. As strain gauge 86 experiences a change in strain because of the raising or lowering of tongue 83, piezoelectric crystal 91 is caused to contract or expand in proportion to the strain being exhibited which action opens or closes the gate valve in a proportional manner. Set screw 90 serves to adjust beam 89 so that there is no flow of ink through opening 69 when there is no voltage applied to crystal 91.

Seven crystals 71–77 are each bonded over their respective chambers within plate 61 of the battery. The crystals 71–77 are electrically connected to a printed circuit board 92 by appropriate leads (not shown). Similarly, the leads from board 92 pass to strain gauges 86 and 87 as well as to piezoelectric crystal 91 in order to control the system. Printed circuit board 92 is fed by a fourteen conductor flat cable 93. Cable 93 is connected to a resistor printed circuit board 94, and then to a fourteen pin dip socket 96. The entire assembly illustrated in FIG. 6 forms one print head assembly having a battery of seven ink jet printers. To be compatible with commercially available character generators (5×7 dot array) and commonly accepted print sizes (each character 0.25 cm high), the seven individual orifices in the battery of printers must be spaced 0.036 cm apart. Of course, other type fonts can be accommodated by the printing method of this invention, and the number of nozzles and the size of the droplets can be charged within limits dictated by the various components. Nozzle spacings can be taken to be from 0.050 cm (the maximum practical dot size) to 0.012 cm (the minimum nozzle spacing compatible with fabrication techniques for the system shown in FIG. 6).

The crystals may be made of any suitable material capable of deforming upon electrical impulse. One suitable material is lead zirconate—lead titanate ceramics available commercially. Others include Rochelle salt, ammonium dihydrogen phosphate, lithium sulfate and barium titanate.

FIG. 7 is a circuit diagram for the pressure regulator circuit. Variable resistance 70 is the control which enables the system to be calibrated for the normal rest condition of pressure within the system as measured in pulse trap chamber 66 (FIG. 6). Ordinarily, we prefer a slight negative pressure within pulse trap chamber 66 in order to have an inwardly directed meniscus at each of the nozzles. However, any pressure is suitable so long as ink remains in the nozzle and does not drip from the nozzle. When resistance 70 is adjusted to the desired setting, strain gauge 86 measures strain caused by deflection of diaphragm 81. The output of the pressure regulator circuit shown in FIG. 7 is to piezoelectric crystal 91 which operates beam 89 to open and close valve seal 79.

Using a volume displacement means for an ink jet printer requires that the ink system be entirely free of air, and that no cavitation occur. Because of this, it is desirable to remove the gasses dissolved in the ink that would be capable of coming out of solution during the negative pressure pulse. This can be accomplished by boiling the ink or by a process of vacuum deairing. If such "de-aired" ink is exposed to atmospheric conditions, it will quickly reabsorb gasses to regain its original equilibrium state. It is preferred to use a self-contained container and pressure-generating system that isolates the ink from the atmosphere.

Figure 8:
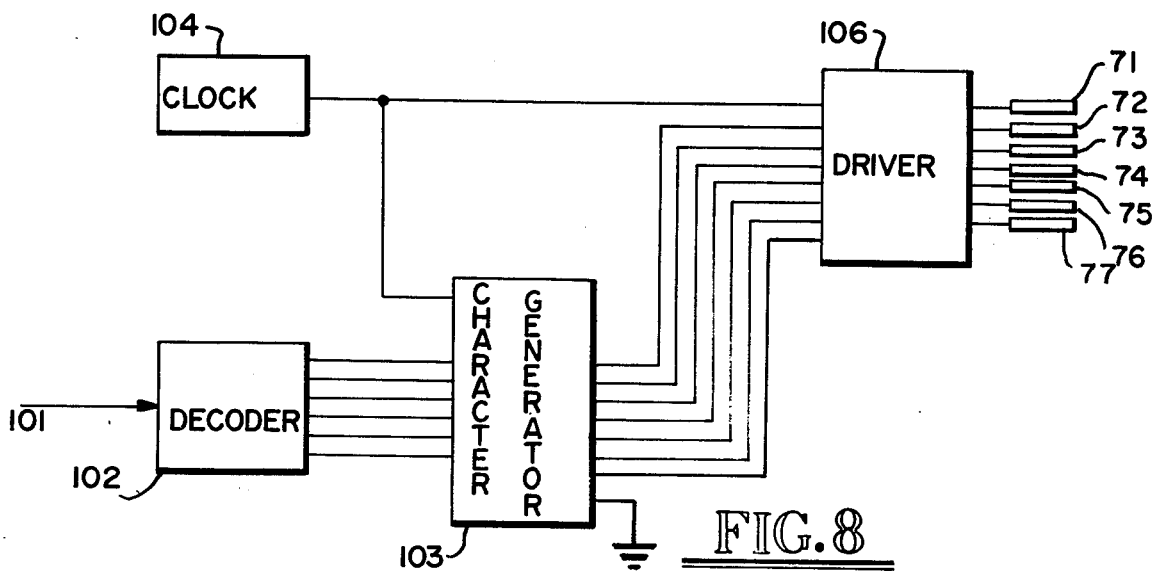
FIG. 8 is a schematic diagram of a system incorporating the ink jet printer of the present invention.

FIG. 8 is a schematic diagram for the control of the printers. A source 101 of alphanumeric characters is fed into a decoder 102. The source may be a key from a typewriter, a computer readout, or other source of alphanumeric characters. Decoder 102 provides the information required to define the specific alphanumeric character in a six bit code. A variety of commercially available decoders may be used. The six bits of information or address are fed to a character generator 103. Dot matrix character generators having 64 characters using five by seven bits are commercially available from many sources. The character generator also has fed into it a strobe pulse train from a clock 104. The pulse train also goes to driver circuit 106 as do the seven outputs of character generator 103. Driver 106 instructs the various crystals on how to fire for the printing of the desired dots to form alphanumeric characters. The seven outputs from driver circuit 106 go to crystals 71-77 overlying the ink chambers.

Figure 9:
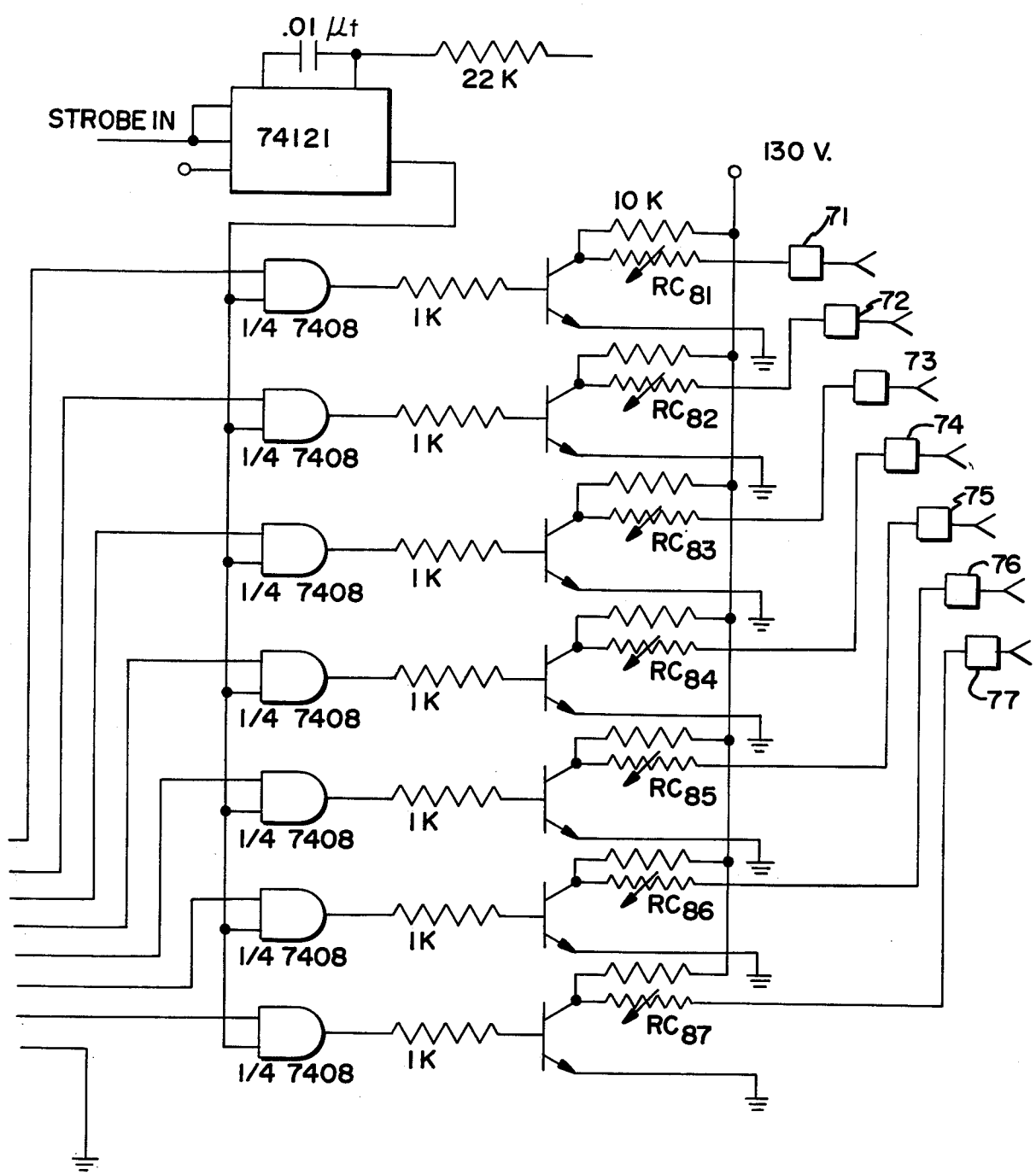
FIG. 9 is a circuit diagram for the driver circuit.

FIG. 9 illustrates the driver circuit for each of the crystals. The seven outputs from the character generator are connected to the driver circuit as illustrated in FIG. 8. The transistors shown in FIG. 9 are all suitable high voltage, low power transistors. The output of driver circuit 106 goes to crystals 71-77 as illustrated.

The size of the dot and the velocity at which it is ejected can be controlled electronically by various means, such as by varying the energy content of the driving pulse, or by changing the shape of the pulse while having the energy content essentially unchanged. The circuit illustrated in FIG. 9 has been designed to control dot size and velocity by means of changing the shape of the driving pulse, and more specifically by changing the rise time of the driving pulse, that is, the rate at which voltage is applied to the crystals. The variable "tuning" resistors are rc 81 to 87 respectively. The crystals have an inherent capacitance due to their construction and geometry. Thus, when the 130 volt "source" voltage is applied, the circuit responds like an R-C circuit, with the resistance being the variable by which control is achieved. The circuit shown in FIG. 9 is capable of controlling the ejection velocity of droplets from zero to maximum attainable with the source of voltage supplied. The resistive elements 81 to 87 may be varied to give a time constant in the range between 5 microseconds and 100 microseconds. This is particularly advantageous for character printer applications, where the velocities of the seven droplets should be equal, while small volume or size variations are unimportant. The size of the dots can be controlled by changing the magnitude of the driving voltage supplied to the crystals. An increased drive voltage generates larger dots, and decreased drive yields smaller drops. In this manner, the darkness of the printed characters can be controlled. As an example, the size of the dot printed on paper from a nozzle with a diameter of 0.010 cm can be varied from approximately 0.010 cm to 0.060 cm.

In operation of the device, the information determining which character is to be printed comes from a source 101, is decoded into a six bit code which selects the correct five by seven matrix in a character generator. The driver circuit fires the appropriate crystal as the battry moves relative to the medium.

Each time a drive pulse is fired, ink volume within one or more of the confined chambers is reduced to suddenly expel a single droplet asynchronously towards the recording medium. This gives a recording system which is entirely on call, and does not fire during idle periods, either between characters when printing or when the printer is inactive. The desired dots can be formed or not as the printing head is stepped along relative to the recording medium. A stepper motor may conveniently be used to move the printing head to form each character in the X axis while dots can be formed in the Y axis by selectively causing specific drive crystals to be fired.

Using the device of the present invention a computer print-out, for example, can be produced at high speeds (up to 1000 characters per second) without the cost, noise and power requirements associated with impact printers currently in use. The device is light in weight and highly reliable.

We claim:

1. In an ink-jet printer having an ink source feeding an ink chamber which opens to a nozzle directed to a recording medium, and drive means for providing asynchronous electrical signals to drive the printer responsive to predetermined patterns, the improvement comprising means responsive to said electrical signals to displace a predetermined quantity of ink from said ink chamber, asynchronously upon receipt of each signal from said drive means, independent of all previous signals, with sufficient force to project a single droplet of ink to said recording medium in a substantially straight trajectory, wherein the nozzle cross-section is of a size to permit ink to refill the nozzle by capillary action upon ejection of a droplet, and further wherein the nozzle length is 2 to 4 times the average cross-sectional dimensions of the nozzle.

2. In an ink-jet printer having an ink source feeding an ink chamber which opens to a nozzle directed to a recording medium, and drive means for providing asynchronous electrical signals to drive the printer responsive to predetermined patterns, the improvement comprising means responsive to said electrical signals to displace a predetermined quantity of ink from said ink chamber, asynchronously upon receipt of each signal from said drive means, independent of all previous signals, with sufficient force to project a single droplet of ink to said recording medium in a substantially straight trajectory, wherein the ink chamber is separated from the nozzle by a neck of short length and large cross-sectional area to limit the pressure drop between said chamber and said nozzle.

3. In an ink-jet printer of a type having an ink source feeding an ink chamber which opens to a nozzle directed to a recording medium, and drive means for providing asynchronous electrical signals to drive the printer responsive to predetermined patterns, the improvement comprising a battery of at least five such printers placed with their nozzles in close proximity to permit printing of characters responsive to electrical signals, each of said printers including means responsive to said electrical signals to displace a predetermined quantity of ink from said ink chamber, asynchronously upon receipt of each signal from said drive means, independent of all previous signals, with sufficient force to project a single droplet of ink to said recording medium in a substantially straight trajectory.

4. A printer system for non-impact printing of characters on a record web comprising:
  means for advancing record web in a selected plane;
  means defining a plurality of spaced apart outlet orifices disposed substantially transversely to the record web, said outlet orifices being directed substantially normal to the record web plane and being in communication with an ambient pressure environment at the record web;
  a liquid source;
  a plurality of variable volume chambers each having spaced apart broad walls, said chambers each including an electrical signal responsive variable curvature wall element in a broad wall thereof and each being in communication with a different outlet orifice, and in separate communication with said liquid source;
  a plurality of signal generating means each coupled to energize a different one of said signal responsive wall elements with an impulse signal, the signal being selected to provide a transient volume change in the associated variable volume chamber such that a single ink jet drop is emitted from the communicating outlet orifice in the direction of the record web with sufficient velocity to impinge substantially normally upon the record web asynchronously for each signal independent of all previous signals; and
  means for selectively controlling said signal generating means such that patterns of characters are printed on said record web.

5. A system as in claim 4 wherein said variable curvature wall element consists of two electrically distortable polarized crystals, bonded transversely as to polarity, having electrical conductors in opposite surfaces thereof to apply voltage across said two crystals whereby the dimensions of said crystals are altered to deflect said crystals inwardly toward said chamber.

6. Apparatus for printing information emanating at high speed from an associated apparatus in the form of electrical signals coded to provide characters upon decoding and printing comprising a decoder, a character generator cooperatively engaging said decoder to supply character signals, a printing head responsive to said signals comprising a battery of ink-jet printers disposed proximately to a recording medium, the battery comprising a series of nozzles separately supplied with ink and separately responsive to an electrical signal, each nozzle to produce a single droplet asynchronously, independent of previous signals, means for moving the battery of ink-jet printers relative to the recording medium, whereby the coded signals are translated and printed as characters on said printing medium, said battery additionally comprising a pair of ceramic plates bonded together, at least one of said plates having cavities therein to form, upon bonding, a pulse trap chamber, a series of interconnected ink chambers, necks and nozzles, each of said series of ink chambers, necks and nozzles fed by the pulse trap chamber and opening to atmosphere at said nozzles, and directed to said recording medium, and a series of crystals electrically connected to said character generator, each crystal capable of contracting upon receiving electrical impulse and bonded to one of said ceramic plates to overlie a cavity forming an ink chamber, whereby any one of said crystals will contract upon electrical impulse to deflect the plate into the associated cavity to suddenly displace a sufficient volume of ink to eject a single droplet of ink in a substantially straight trajectory to the record medium.

7. Apparatus as in claim 6 wherein there are seven nozzles, necks and ink chambers in said series and the nozzles are between 0.005 and 0.025 centimeters in diameter and disposed so that the distance between the first and last of the nozzles in the series does not exceed 0.25 centimeters.

8. Apparatus as in claim 7 wherein each of the ink chamber cavities has a volume between $1.6 \times 10$ and $1.6 \times 10^{-2}$ cubic centimeters cubic inch.

9. The method of printing symbols, comprising:
  defining as a series of printed dots the symbols to be printed,
  confining a series of separate volumes of ink directed to a recording medium along one axis,
  suddenly reducing the volume of those confined volumes asynchronously corresponding to the desired dots of character to be printed to project droplets of ink to the recording medium,
  providing relative motion between the series of volumes of ink and the recording medium perpendicular to said one axis,
  repeating the sudden reduction of volumes to project a second set of dots in the desired pattern,
  again providing relative motion between the series of volumes of ink and the recording medium, and
  repeating the process until the symbols to be printed are complete.

10. The method of claim 9 wherein at least one of the series of volumes are reduced and the series moved relative to the recording medium at a rate less than 50,000 per second.

11. A method as in claim 9 wherein the diameter of each projected droplet is between 1 and 3 times the average cross-sectional dimension of the orifice.

12. A method as in claim 9 wherein said defined series of printed dots is within a matrix seven dots high and five dots wide.

13. The method of controlling droplet velocity in an ink jet printer in which droplets are ejected from a battery of nozzles, each droplet ejected responsive to an electronic drive pulse, the improvement comprising adjusting the rise time for each electronic drive pulse to give the same velocity to each droplet ejected from the battery, no matter which nozzle it is ejected from.

14. In an ink jet printer using a battery of piezoelectric crystals, each having inherent capacitance, to displace volume in corresponding ink chambers, each cooperating with a nozzle, in which deformation of the crystal displaces ink in the ink chamber to asynchronously eject a single droplet of ink from the nozzle, the improvement comprising a plurality of variable magnitude resistive elements each in series with a piezoelectric crystal to form an R-C circuit for varying resistance so that the velocity and/or volume of each droplet ejected from each nozzle in the battery is the same.

15. In an ink jet printer as in claim 14 wherein the resistive elements can be varied to give a time constant of the R-C circuit in the range between 5 microseconds and 100 microseconds.

* * * * *